United States Patent [19]

Schiek et al.

[11] Patent Number: 4,982,164
[45] Date of Patent: Jan. 1, 1991

[54] METHOD OF CALIBRATING A NETWORK ANALYZER

[75] Inventors: Burkhard Schiek, Bochum; Eul-Hermann-Josef, Essen, both of Fed. Rep. of Germany

[73] Assignee: Rhode & Schwarz GmbH & Co. K.G., Fed. Rep. of Germany

[21] Appl. No.: 338,628

[22] Filed: Apr. 17, 1989

[30] Foreign Application Priority Data

Apr. 22, 1988 [DE] Fed. Rep. of Germany ....... 3813938
May 20, 1988 [DE] Fed. Rep. of Germany ....... 3817209

[51] Int. Cl.$^5$ ............................................. G01R 27/02
[52] U.S. Cl. ..................................... 324/638; 324/601
[58] Field of Search ................. 324/58 R, 58 A, 58 B, 324/58.5 R, 58.5 A, 58.5 B, 601, 629, 638, 641, 642, 646

[56] References Cited

U.S. PATENT DOCUMENTS 4,853,613 8/1989 Sequeira et al. ................... 324/58 R

OTHER PUBLICATIONS

"12-Term System-Error Correction in Network Analysis", News from Rohde & Schwarz, vol. 108, No. 1, Winter of 1985, pp. 26–27.
HP8510 TRL Calibration Technique of Hewlett Packard, Product Note 8510-8, Oct. 1987.
Franzen et al: "A New Procedure for System Calibration ... ", 5th European Microwave Conference-Sep. 1975.
Cronson et al: "A Dual Six-Port Automatic Analyzer" Conference: Technology Growgh for the 80's, May 1980.
Hewlett-Packard Product Note 8510-5: "Specifying Calibration Standards for the HP8510 Network Analyzer", Mar. 1986.
Rytting: "An Analysis of Vector Measurement Accuracy Enhancement Techniques" RF: Microwave Measurement Symposium and Exhibition, Mar. 1982.

Primary Examiner—Gerard R. Strecker
Assistant Examiner—Robert W. Mueller
Attorney, Agent, or Firm—Hill, Van Santen, Steadman & Simpson

[57] ABSTRACT

For calibrating a network analyzer, calibration measurements are successively performed in any desired order on three different calibration standards connected between the two test ports; the first calibration standard is a two-port circuit all of whose complex scatter parameters are known and which is, for example, implemented by a direct connection of the two test ports; the second calibration standard is an attenuator of random transmission but known reflection; the third calibration standard preferably is a two-port circuit exhibiting random reflection which, however, is equal on both sides and different from the reflection of the second calibration standard.

25 Claims, 3 Drawing Sheets

METHOD OF CALIBRATING A NETWORK ANALYZER

BACKGROUND OF THE INVENTION

1. Field of the Invention

Network analyzers are used to measure the scattering parameters of electronic circuits and components in the RF and microwave range (for example network analyzer ZPV-Z5 of Rohde & Schwarz). A network analyzer comprises two test ports between which any desired two-port circuits of a multi-port test item can respectively be linked. It is possible through at least one of these test ports to feed an RF signal from an RF generator into the test item, and measurements by magnitude and phase may then be performed on the two-port of the test item by means of signal detectors such as voltmeters which may be coupled to these test ports via bridge circuits or directional couplers. For the complete determination of the scatter matrix $$[S] = \begin{bmatrix} S_{11} & S_{12} \\ S_{21} & S_{22} \end{bmatrix}$$

of a two-port, four complex measurements by magnitude and phase are required at each frequency point, i.e. reflection measurements at the input and the output of the test item ($S_{11}$ and $S_{22}$) and transmission measurements in both the forward and reverse directions ($S_{21}$ and $S_{12}$). Since a linear two-port is completely represented by this set of four complex scattering parameters at each frequency point, all further interesting parameters such as input and output impedance, transmission or return loss as well as delays can easily be determined from these scattering parameters by conversion. A network analyzer therefore proves to be a general-purpose and versatile measuring instrument for use at RF frequencies. In practice, the measurements involve a number of errors of measurement brought about by the imperfections of the network analyzer, for example by a finite directivity or mismatch of measuring bridges or directional couplers at the test ports. But these system errors can be fully determined through a calibration process and can subsequently be eliminated by computation. This leads to an improved measurement accuracy and a broader bandwidth of such a network analyzer.

2. Description of the Prior Art

It is known that the imperfections of a network analyzer can be described by twelve complex error measurements on four calibration standards (News from Rohde & Schwarz, 108, winter of 1985/1, pp. 26/27). Furthermore it is also known for such calibration measurements to use only three calibration standards and to determine with a reduced number of measurements all of the error parameters of a network analyzer (HP 8510 TRL calibration technique of Hewlett Packard Product Note 8510-8, October 1987). All of the scattering parameters of the first calibration standard are known, in the simplest case this calibration two-port is realized by a through-connection of the two test ports (Thru measurement). The second calibration standard is a one-port with a high reflection coefficient which is linked to the two test ports in succession (Reflect measurement). The third calibration standard is a short electrical line of random length which is non-reflectively matched to the test ports (Line measurement). The sequence of the various measurements of scatter parameters on these three calibration standards is arbitrary, so that the line measurement could also be performed before the reflect measurement. Although this known calibration technique requires only three calibration standards, the technical implementation, especially of the third calibration standard in the form of the non-reflectively matched electrical line, is relatively difficult. The electrical length of the line has to be chosen so that a certain phase displacement is obtained which is not in the vicinity of 0° and 180°, respectively. Using such a line, however, means that with increasing frequency, ranges are repeatedly passed in which the electrical length is in the vicinity of multiples of one-half of the wavelength so that such a line becomes useless for calibration. Moreover, a line always has a lower frequency limit so that it is not a broad-band device, and with increasing electrical length of the line, the relative bandwidth where such a line may be used as calibration standard becomes less and less. Therefore the technical realization of such a coaxial calibration line is relatively difficult.

SUMMARY OF THE INVENTION

It is therefore the object of the present invention to provide a calibration method for network analyzers in which the calibration standards can be set up in a simple and less expensive way.

Proceeding from the known three-standard calibration method, the specified object is solved by the use of standards with the various possible combinations as specified herein.

In accordance with a first solution offered by the present invention, an attenuator is used as a calibration standard instead of an electrical line which, in practice, can be realized only with difficulty especially for lower frequencies; the attenuator can be designed simply and inexpensively from concentrated components. It is only necessary that the reflection at the input and the output should be known, which is most easily achieved by non-reflective matching (zero reflection). Suitable attenuators are known reciprocal attenuator circuits with equal attenuation in either direction, but also non-reciprocal attenuator circuits or isolators with different attenuation in forward and reverse directions. For the third calibration standard it is only necessary that the reflection is equal on either side of the two-port circuit and is different from the reflection of the second calibration standard.

Within the meaning of the present invention, the term attenuator does not represent a self-contained two-port circuit; it will be sufficient that in this second calibration standard some attenuation with arbitrary transmission is produced. It would be conceivable, for instance, that the second calibration standard is a coaxial line or a hollow waveguide in which a certain RF radiation is permitted at some location, i.e. in which the attenuation is obtained by radiation. It would also be conceivable that some material providing RF losses is incorporated in a coaxial line, a hollow waveguide portion or a stripline. This can be achieved in a known way as when forming so-called waveguide terminations, by incorporating a tapered piece of absorptive material in the line; however, complete absorption of energy by this material is not required, it will suffice to prevent reflection. All commercially available attenuators are suitable for this second calibration step, wherein transmission respectively means magnitude and phase of the attenuation. The attenuator may, for instance, be composed of concentrated components in the form of T-circuits or pi-circuits.

The use of an attenuator as the second calibration standard offers the significant advantage that this standard has no lower frequency limit, and even at high frequencies avoids critical ranges in which calibration is no longer possible with the known standard in the form of a line.

In accordance with a second solution of the present invention, the third calibration standard used is not a one-port circuit alternatingly linked to the two test ports, as already known, but is also a two-port circuit which may have any desired attenuation. In this way it is possible also to provide this third calibration standard with the required characteristics in a simple and economic way.

The third calibration standard need not necessarily be a symmetrical two-port circuit; it is quite possible to use an asymmetrical two-port circuit of which, however, one reflection parameter $S_{11}$ or $S_{22}$ (or the equivalent parameters related thereto) would have to be known. However, for this purpose it is easier to realize symmetrical two-port circuits whose reflection need then not be known.

Since the reflection required for this third calibration standard need only be different from that of the second standard, this can easily be achieved by a corresponding modification of the second calibration standard. For example, for a network analyzer comprising waveguide test ports it would be easy to realize this two-port circuit for the third calibration measurement simply by a waveguide portion in which a dielectric block is symmetrically incorporated. For a network analyzer with coaxial line test ports it is common practice to provide as calibration standard precision air lines comprising an outer conductor and several inner conductors of different diameters. Thus, the third calibration standard can easily be realized, for instance, by inserting into the outer conductor a "wrong" inner conductor relative to the respective reference impedance, whereby a non-matched line with arbitrary reflection is obtained in a simple way.

In stripline technique the third calibration standard may be realized in the form of open-circuit stripline lengths which represent high reflection and in which sufficient equality may be assumed also because of the symmetry.

Finally, it is also possible to design this third calibration standard as a pure series impedance Z or shunt impedance Z so that the calibration two-port circuit has only one unknown parameter, i.e. Z, while it is otherwise symmetrical. Thus, all s-parameters of this two-port circuit clearly depend on said single parameter Z, and due to the character of a concentrated component there will also not arise any unclarity as to the sign in the reflection parameters $S_{11}$ and $S_{22}$, respectively. For this third calibration measurement on a two-port circuit with a series or shunt impedance Z it would also be possible, if desired, directly to use a corresponding test item so that this third separate calibration measurement can be omitted because in that case the lacking calibration data can be obtained direct from the test item.

This third calibration standard, which is advantageously designed as a two-port circuit, cannot only be used in combination with the second calibration standard, which is designed as an attenuator, but it may also be used as third calibration standard, for example also for the reflection measurement of the above-mentioned known calibration method, in which an electrical line is used as a second calibration standard.

A particularly simple solution for the specified combination resides in that as the second calibration standard the aforementioned coaxial precision aerial line is used again though with the correct inner conductor in this case, so that matching and thus zero reflection is achieved, while the third calibration standard is again the unmatched line comprising the "wrong" inner conductor. Analogously, the second standard could be a stripline, wherein the third standard is produced simply by symmetrically placing a dielectric on the stripline for the third calibration measurement.

BRIEF DESCRIPTION OF THE DRAWING

Other objects, features and advantages of the invention, its organization, construction and operation will be best understood from the following detailed description taken in conjunction with the accompanying drawing, on which.

Figure 1:
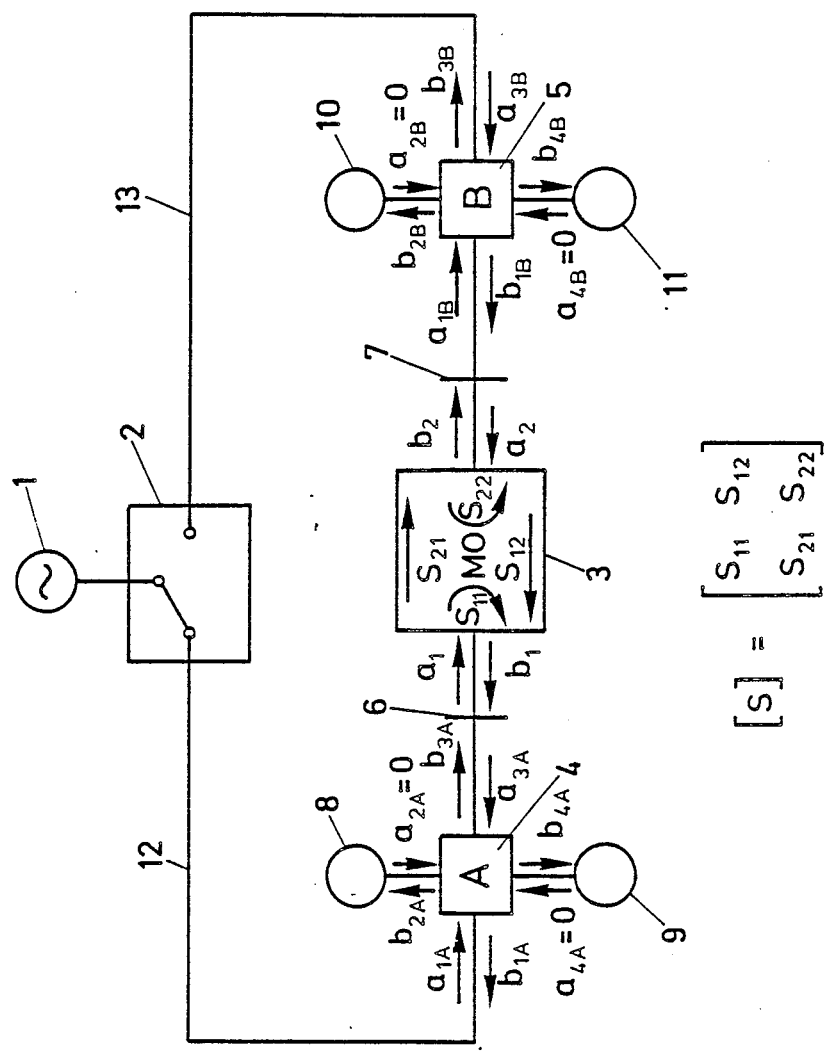
FIG. 1 is a schematic representation of a network analyzer using a calibration method according to the present invention.

The figure shows the basic circuit diagram of a usual network analyzer (for example network analyzer ZPV-Z5 of Rohde & Schwarz), in which two separate measuring branches 12 and 13 are supplied through a three-port circuit 2, which may be a reversing switch, from an RF generator 1 which is frequency-variable within a predetermined frequency range. The two alternatingly connected measuring branches 12 and 13 lead to four-port circuits 4 and 5 which are designed as measuring bridges or directional couplers and to which signal detectors 8, 9 and 10, 11 are respectively linked by means of which voltage measurements by magnitude and phase can be performed. These, signal detectors may be mismatched. Also, the four-port circuits 4 and 5 have test ports 6 and 7 connected thereto between which a two-port circuit 3 can be linked as test item. It is thereby possible via the signal detectors 8, 9 and 10, 11 to measure at the input and the output of a linked test item 3 the respective complex reflection factors $S_{11}$ and $S_{22}$ and also the complex transmission factors $S_{12}$ and $S_{21}$ in both forward and reverse directions. These four measured complex scattering parameters $S_{11}$, $S_{22}$, $S_{12}$, and $S_{21}$ therefore give a complete representation of a linear two-port circuit for any particular frequency, and all further unknown quantities of interest can be derived from these values.

In the calibration method according to the present invention, by which the errors of measurement of the system are determined which can subsequently be taken into account for measuring a test item, three calibration two-port circuits having the above-described special dimensioning are linked in succession between the test ports 6 and 7 instead of the test item 3, whereby the respective scattering parameters are determined from which then the error parameters of the network analyzer are derived. These error parameters may be stored in a memory provided in the network analyzer to be correspondingly taken into account for subsequent measurements.

The calibration method in accordance with the present invention cannot only be used for network analyzers in which a measuring RF voltage can be fed from either side into a test item but the method may also be used with network analyzers of the type in which only a single measuring branch 12 is provided and only one signal detector is linked to the second test port 7 for detecting magnitude and phase. Moreover, the method according to the present invention is suited for network analyzers with waveguide outputs as well as for network analyzers with coaxial line outputs (test ports).

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

Below, it will be proved mathematically that within the meaning of the present invention the simplifications on the calibration standards in the three successive calibration measurements are actually admissible, viz. the simplification that a twoport is sufficient for the second calibration standard wherein at most two scattering parameters thereof may be unknown, while it is sufficient to use a twoport for the third calibration standard wherein even a maximum of three scattering parameters may be unknown.

The portion of the measuring apparatus comprised of the fourport 4, the test port 6 and the detectors 8 and 9 can be interpreted without any loss of generality by a fictitious displacement of the reference planes as a four-port which includes the imperfections of the detectors and of the test port, to which four-port circuit error-free detectors and an ideal test port are linked. Then, $a_{2A}=0$ and $a_{4A}=0$, and the following equations apply:

$$b_{1A} = S_{11A}a_{1A} + S_{13A}a_{3A} \tag{1}$$

$$b_{2A} = S_{21A}a_{1A} + S_{23A}a_{3A} \tag{2}$$

$$b_{3A} = S_{31A}a_{1A} + S_{33A}a_{3A} \tag{3}$$

$$b_{4A} = S_{41A}a_{1A} + S_{43A}a_{3A}, \tag{4}$$

which are reduced to $$\begin{pmatrix} b_{2A} \\ b_{4A} \end{pmatrix} = \begin{pmatrix} A_{11} & A_{12} \\ A_{21} & A_{22} \end{pmatrix} \begin{pmatrix} a_{3A} \\ b_{3A} \end{pmatrix} \tag{5}$$

Analogously, the portion of the network analyzer comprised of the four-port circuit 5, the test port 7, and the detectors 10 and 11 can be described by the following relationships:

$$b_{1B} = S_{11B}a_{1B} + S_{13B}a_{3B} \tag{6}$$

$$b_{2B} = S_{21B}a_{1B} + S_{23B}a_{3B} \tag{7}$$

$$b_{3B} = S_{31B}a_{1B} + S_{33B}a_{3B} \tag{8}$$

$$b_{4B} = S_{41B}a_{1B} + S_{43B}a_{3B} \tag{9}$$

which are again reduced to $$\begin{pmatrix} b_{2B} \\ b_{4B} \end{pmatrix} = \begin{pmatrix} B_{11} & B_{12} \\ B_{21} & B_{22} \end{pmatrix} \begin{pmatrix} b_{1B} \\ a_{1B} \end{pmatrix}. \tag{10}$$

A twoport 3 linked between the test ports 6 and 7 and having the transmission parameter matrix T $$\begin{pmatrix} b_1 \\ a_1 \end{pmatrix} = \begin{pmatrix} T_{11} & T_{12} \\ T_{21} & T_{22} \end{pmatrix} \begin{pmatrix} a_2 \\ b_2 \end{pmatrix}, \tag{11}$$

on account of the relationships $$b_1 = a_{3A}, \ a_1 = b_{3A}, \ a_2 = b_{1B} \text{ and } b_2 = a_{1B} \tag{13}$$

by using the equations (5) and (10) will lead to $$\begin{pmatrix} b_{2A} \\ b_{4A} \end{pmatrix} = \begin{pmatrix} A_{11} & A_{12} \\ A_{21} & A_{22} \end{pmatrix} \begin{pmatrix} T_{11} & T_{12} \\ T_{21} & T_{22} \end{pmatrix} \begin{pmatrix} B_{11} & B_{12} \\ B_{21} & B_{22} \end{pmatrix}^{-1} \begin{pmatrix} b_{2B} \\ b_{4B} \end{pmatrix}. \tag{14}$$

Equation (14) describes the arrangement in the first of the two states which the threeport 2 may adopt. The parameters of this threeport may be completely unknown in either state, and it is only required that they are reproducible and result in linearly independent measured values. The operation of the measuring apparatus in its second state results in changed measured values which shall be indicated by a prime ' so that, analogous to equation (14), the following equation holds:

$$\begin{pmatrix} b'_{2A} \\ b'_{4A} \end{pmatrix} = \begin{pmatrix} A_{11} & A_{12} \\ A_{21} & A_{22} \end{pmatrix} \begin{pmatrix} T_{11} & T_{12} \\ T_{21} & T_{22} \end{pmatrix} \begin{pmatrix} B_{11} & B_{12} \\ B_{21} & B_{22} \end{pmatrix}^{-1} \begin{pmatrix} b'_{2B} \\ b'_{4B} \end{pmatrix}. \tag{15}$$

Combining the two vector equations will result in the matrix equation $$\begin{pmatrix} b_{2A} & b'_{2A} \\ b_{4A} & b'_{4A} \end{pmatrix} = \tag{16}$$

$$\begin{pmatrix} A_{11} & A_{12} \\ A_{21} & A_{22} \end{pmatrix} \begin{pmatrix} T_{11} & T_{12} \\ T_{21} & T_{22} \end{pmatrix} \begin{pmatrix} B_{11} & B_{12} \\ B_{21} & B_{22} \end{pmatrix}^{-1} \begin{pmatrix} b_{2B} & b'_{2B} \\ b_{4B} & b'_{4B} \end{pmatrix},$$

which is written as $$M = ATB^{-1} \tag{17}$$

wherein $$M = \begin{pmatrix} b_{2A} & b'_{2A} \\ b_{4A} & b'_{4A} \end{pmatrix} \begin{pmatrix} b_{2B} & b'_{2B} \\ b_{4B} & b'_{4B} \end{pmatrix}^{-1} \tag{18}$$

is composed of measured values and $$A = \begin{pmatrix} A_{11} & A_{12} \\ A_{21} & A_{22} \end{pmatrix}, T = \begin{pmatrix} T_{11} & T_{12} \\ T_{21} & T_{22} \end{pmatrix}, B = \begin{pmatrix} B_{11} & B_{12} \\ B_{21} & B_{22} \end{pmatrix} \quad (19)$$

When the elements of the matrices A and B are known it is possible from the measured values $$MX = A \, NX \, B^{-1} \quad (20)$$

of an unknown test item with the transmission matrix NX to determine the parameters of the test item by means of $$NX = A^{-1} \, MX \, B \quad (21)$$

The measuring problem of a network analyzer can therefore be reduced to a mathematical form according to equation (17), it being immaterial whether in this representation the matrices of interest occur themselves or as their inverses. For calibration it is therefor only necessary to define the matrices A and B.

Basically, the measuring equipment can be calibrated by three known two-port circuits N1, N2, N3 which are represented by their transmission parameter matrices N1, N2 and N3. Assume that the related measured values are $$M1 = A \, N1 \, B^{-1}, \quad (22)$$

$$M2 = A \, N2 \, B^{-1}, \quad (23)$$

$$M3 = A \, N3 \, B^{-1}. \quad (24)$$

From equation (22)

$$B^{-1} = N1^{-1} A^{-1} M1 \quad (25)$$

is obtained; upon substitution in equation (23) one obtains $$A \, P = Q \, A \quad (26)$$

with $$P = N2 \, N1^{-1} \text{ and } Q = M2 \, M1^{-1}, \quad (27)$$

whence by equivalent transformation the system of linear equations $$\left( \begin{array}{c|c} P^t & O \\ \hline O & P^t \end{array} \right) A - \left( \begin{array}{c|c} EQ_{11} & EQ_{12} \\ \hline EQ_{21} & EQ_{22} \end{array} \right) A = 0 \quad (28)$$

or $$C \, A = 0 \quad (29)$$

$$(30)$$

wherein $C = \left( \begin{array}{c|c} P^t - EQ_{11} & -EQ_{12} \\ \hline -EQ_{21} & P^t - EQ_{22} \end{array} \right),$ $$A = (A_{11}, A_{12}, A_{21}, A_{22})^t, \quad (31)$$

$$E = \begin{pmatrix} 1 & 0 \\ 0 & 1 \end{pmatrix} \text{ und } O = \begin{pmatrix} 0 & 0 \\ 0 & 0 \end{pmatrix} \quad (32)$$

is produced in which $P^t$ represents the matrix transposed to P. It can be shown that the matrix in equation (30) has rank 2 and therefore does not permit sufficient determination of A. Using the equations (22) and (24) a second system of equations of similar kind is therefore derived through $$A \, U = V \, A \quad (33)$$

in which $$U = N3 \, N1^{-1} \text{ and } V = M3 \, M1^{-1} \quad (34)$$

so that $$\tilde{C} A = 0 \quad (35)$$

wherein $$\tilde{C} = \left( \begin{array}{c|c} U^t - EV_{11} & -EV_{12} \\ \hline -EV_{21} & U^t - EV_{22} \end{array} \right). \quad (36)$$

A suitable combination of equations (29) and (35) provides the system of equations $$C A = 0 \quad (37)$$

wherein $$C = \left( \begin{array}{c|c} P^t - EQ_{11} & -EQ_{12} \\ \hline -EV_{21} & U^t - EV_{22} \end{array} \right), \quad (38)$$

which has rank 3 and therefore permits the determination of the elements of matrix A with the exception of a scalar factor referenced $\alpha$, so that $$A = \alpha \tilde{A} \quad (39)$$

Starting from equation (21) and using equation (25) it is then possible by $$NX = A^{-1} \, MX \, B = A^{-1} \, MX \, M1^{-1} \, A \, N1 \quad (40)$$

$$= \frac{1}{\alpha} A^{-1} \, MX \, M1^{-1} \, \alpha A \, N1 \quad (41)$$

$$= A^{-1} \, MX \, M1^{-1} \, A \, N1 \quad (42)$$

to determine the parameters of the test item which are corrected as to system errors, thus demonstrating that the measuring apparatus can basically be calibrated.

It should be noted here that C cannot have rank 4 because the homogeneous system of equations (37) always has at least one non-trivial solution, viz. the actual $A_{1j}$, so that $\det C = 0$ must be satisfied, which means $\text{ran} C < 4$.

Since a total of 12 measured values is available for determining the remaining seven parameters, the equations (22), (23) and (24) contain redundances which are used to reduce the practical requirements on the calibration standards in such a way that certain parameters may remain unknown in these standards. The present invention is based thereon.

In the calibration method according to the present invention one of the calibration twoports is still assumed to be completely known which, without any limitation of generality, shall be N1 with its transmission parameter matrix N1.

The second calibration two-port circuit N2 (numbering and order are arbitrary) has undetermined parameters, which is taken into account by setting up N2 with a number of unknown parameters but with known dependences of the matrix elements on these parameters, so that:

$$N2(p) = \begin{pmatrix} N2_{11}(p) & N2_{12}(p) \\ N2_{21}(p) & N2_{22}(p) \end{pmatrix} \text{with } p = (p_1, \ldots, p_n), n \in N. \quad (43)$$

Accordingly, C also is a function of p and generally is not singular for every p. It is only for certain parameters —among others the 'correct' parameters—that the determinant will vanish so that these parameters can be determined by solving the eigenvalue problem $$\det C(p) = 0, \text{rang} C(p) = 2 \quad (44)$$

which for the practically important case of $$N1 = \begin{pmatrix} 1 & 0 \\ 0 & 1 \end{pmatrix}, \quad (45)$$

i.e. direct linking of the two test ports, will result in the relationships $$N2_{11}(p) + N2_{22}(p) = Q_{11} + Q_{22} \quad (46)$$

$$N2_{12}(p)N2_{21}(p) + [N2_{22}(p) - Q_{11}][N2_{22}(p) - Q_{22}] = -Q_{12}Q_{21} \quad (47)$$

so that at most two degrees of freedom, $p = (p_1, p_2)$, are allowable. It is apparent from the two equations (46) and (47) that a maximum of two unknown parameters is allowable for the second calibration standard, which is fully utilized in practice for example when an isolator is used.

When a reciprocal calibration standard is used, the transmission coefficient must be equal in either direction so that basically only a single unknown parameter is still concerned. Nevertheless, the possibility of two different parameters is advantageous also in this case, because deviations from equality are highly suitable as a measure for the quality of this calibration step.

Possible implementations are, for example, T- or π-circuits. A matched attenuator or isolator of known or unknown transmittance is especially recommended. Since these twoports need not satisfy any requirements in respect of observing predetermined attenuation or isolation, they may be optimized for matching which is a less critical task than the manufacture of a termination with optimum matching. It is therefore well justified to use the input impedance as a reference, i.e.:

$$N2 = \begin{pmatrix} K & 0 \\ 0 & L \end{pmatrix}. \quad (48)$$

When the two-port circuit is nonmatched its input impedance or at least the product $S2_{11}S2_{22}$ or $N2_{12}N2_{21}$ of the elements of the scattering or transmission parameter matrix must be known.

For some applications it may be appropriate to use for the standard N2 a line of random complex propagation constant γ and random unknown length l, viz.

$$N2 = \frac{1}{e^{-\gamma l}(1-\rho^2)} \begin{pmatrix} e^{-2\gamma l} - \rho^2 & \rho(1 - e^{-2\gamma l}) \\ -\rho(1 - e^{-2\gamma l}) & 1 - \rho^2 e^{-2\gamma l} \end{pmatrix} \quad (49)$$

with the reflection coefficient $$\rho = \frac{Z_L - Z_0}{Z_L + Z_0}, \quad (50)$$

wherein $Z_L$ is the characteristic impedance of the used line and $Z_0$ is the reference characteristic impedance on which the measurement shall be based. The choice of $Z_0 = Z_L$ is especially suitable, so that $$N2 = \begin{pmatrix} e^{-\gamma l} & 0 \\ 0 & e^{\gamma l} \end{pmatrix} \begin{pmatrix} K & 0 \\ 0 & 1/K \end{pmatrix} \quad (51)$$

holds for the line, which means that the measuring equipment is calibrated to the characteristic impedance of this line.

The unknown factors K and L are determined by solving the eigenvalue problem (44) which also has 1/K and 1/L as solution which, however, can be excluded due to the passivity of N2. This is where some drawbacks become apparent when a line is used, because in connection with (45)

$$K = \frac{1}{L} \neq \pm 1 \quad (52)$$

is required. As eigenvalues of (44) these values are still allowable; but they are not suited for the further calibration of the measuring equipment. This means that the length of a loss-free line must differ from multiples of one-half the wavelength. But this drawback cannot be eliminated even by lossy lines, because highly lossy lines normally do not exhibit a real characteristic impedance so that they may surely be used as a remedy only in special cases. Though low-loss lines exhibit sufficiently real characteristic impedances, they produce extremely badly conditioned systems of equations in the vicinity of the points which are singular for loss-free lines. These systems of equations do not provide useful results under the influence of measurement errors, noise, quantization effects etc. Furthermore, even with well-dimensioned line lengths these errors may have the result that because of $|e^{-\gamma l}| \approx 1$ it is no longer possible to discriminate safely between the two solutions of (44). Then, the electrical length of the line must be estimated in such a way that a decision can be made whether $e^{-\gamma l}$ is in the upper or the lower complex half-plane.

An attenuator, on the other hand, permits uniformly good calibration throughout a basically unlimited frequency range and offers unique discrimination between the two solutions.

Similar to N2, the following approach is made for the third calibration standard N3 with the unknown parameters q:

$$N3(q) = \begin{pmatrix} N3_{11}(q) & N3_{12}(q) \\ N3_{21}(q) & N3_{22}(q) \end{pmatrix} \text{ with } q = (q_1, \ldots, q_n), n \in N. \quad (53)$$

Also analogous to the equations (46) and (47), $$N3_{11}(q) + N3_{22}(q) = V_{11} + V_{22}, \quad (54)$$

$$N3_{12}(q)N3_{21}(q) + [N3_{22}(q) - V_{11}][N3_{22}(q) - V_{22}] = V_{12}V_{21} \quad (55)$$

are derived from equation (35). Moreover, there are two further equations, $$L\, N3_{11}(q) + K\, N3_{22}(q) = K L(W_{11} + W_{22}), \quad (56)$$

$$\frac{N3_{12}(q)N3_{21}(q)}{KL} + \left[\frac{N3_{22}(q)}{L} - W_{11}\right]\left[\frac{N3_{22}(q)}{L} - W_{22}\right] = W_{12}W_{21}, \quad (57)$$

wherein $$W = M3\, M2^{-1}, \quad (58)$$

which result from the combination with Nw which is completely known from the preceding step, in the present case for example for N2 according to equation (48). Equation (57) is dependent on equation (55), so that at most three degrees of freedom, $q=(q_1,q_2,q_3)$ are available.

A suitable embodiment of N3 is represented by a two-port circuit with symmetrical reflection and with parameters which are unknown with the exception of the sign of $S3_{11}$. A rough knowledge of the design of N3 will suffice for discriminating between the two possible values for $S_{11}$. If a nonreflective calibration standard N2 is used, N3 will have to exhibit reflection.

An ambiguity in the solution will not occur when N3 is implemented as a series or parallel impedance. Even if the behaviour of these elements deviates from that of concentrated elements towards higher frequencies, this solution may still be used to clarify the question of the sign in the complete solution. For example, the value of the series impedance is clearly determined as $$Z = 2 \frac{K(W_{11} + W_{22}) - (K^2 + 1)}{K^2 - 1}. \quad (59)$$

Therefore, in respect of an impedance measuring method the system is already calibrated after utilization of two calibration standards.

If it is nevertheless impossible to decide on the sign, it will still be possible to clearly determine the parameters $S_{12}$ and $S_{22}$ the sign will again be uncertain.

As an alternative to the use of a third two-port circuit N3, it is also possible for instance to use a one-port circuit of known or unknown reflection r. From the measured values $$\begin{pmatrix} b_{2A} \\ b_{4A} \end{pmatrix} = \begin{pmatrix} A_{11} & A_{12} \\ A_{21} & A_{22} \end{pmatrix} \begin{pmatrix} a_{3A} \\ b_{3A} \end{pmatrix} \quad (60)$$

and $$\begin{pmatrix} b_{2B} \\ b_{4B} \end{pmatrix} = \begin{pmatrix} B_{11} & B_{12} \\ B_{21} & B_{22} \end{pmatrix} \begin{pmatrix} b_{1B} \\ a_{1B} \end{pmatrix} \quad (61)$$

wherein $$r = \frac{a_{3A}}{b_{3A}} \text{ bzw} \cdot r = \frac{a_{1B}}{b_{1B}} \quad (62)$$

through $$\frac{b_{2A}}{b_{4A}} = \frac{A_{11}r + A_{12}}{A_{21}r + A_{22}} \overset{def}{=} \Gamma_A \quad (63)$$

and $$\frac{b_{2B}}{b_{4B}} = \frac{B_{11} + B_{12}r}{B_{21} + B_{22}r} \overset{def}{=} \Gamma_B \quad (64)$$

the equations $$rA_{11} + A_{12} - \Gamma_A r A_{21} - A_{22}\Gamma_A = 0 \quad (65)$$

$$B_{11} + rB_{12} - \Gamma_b b_{21} - \Gamma_b r B_{22} = 0 \quad (66)$$

are derived and are used instead of (35) to obtain (37).

If r is known, the rank of (37) will be increased to three and will therefore permit the determination of $\bar{A}$. If r is unknown, $C = C(r)$ will have to be obtained formally, and r will have to be determined by solving the eigenvalue problem $$detC(r) = 0 \quad (67)$$

Since this is again a double-valued solution, an estimation of the sign of r must also be provided in this case. Basically, all values are possible for r with the exception of the case according to equation (48) where $r \neq 0$ must hold. Preferably, however, a short or open circuit is recommended anyway because then, apart from the practical advantages, the clarification of the sign is not critical. In either case there exists a system of equations of rank three, so that the calculation of $\bar{A}$ is possible.

When a known reflection is used, which in the present case is $R \neq \pm 1$, it is additionally possible to interpret this calibration one-port circuit as two-port circuit N2 and to use for N3 the already mentioned known or unknown series or parallel impedance. In that case equations (63) and (64) are used instead of equation (35) to obtain equation (37). With the impedance known, the rank of the system of equations will be increased to 3. With the impedance unknown, $C = C(Z)$ will be derived formally, and Z is initially determined from the eigenvalue equation $$detC(Z) = 0 \quad (68)$$

For instance, using (45) and $R = 0$, there results for a series impedance $$Z = 2 \frac{[(M1_{22} + \Gamma_B M1_{21})W_{12} - (M1_{12} + \Gamma_B M1_{11})(1 - W_{11})][\Gamma_A(1 - W_{11}) - W_{12}]}{W_{12}[(M1_{12} + \Gamma_B M1_{11}) - \Gamma_A(M1_{22} + \Gamma_B M1_{21})]}. \quad (69)$$

Again, in this case the solution is not ambiguous.

A special case of this calibration method is the use of a oneport of known reflection as the second standard which is linked successively to the two test ports. The standard 3 is a known or unknown reflection $r_2$ which again is linked to both test ports in succession and is measured. Analogously to the above, there result the measured values $\Gamma_{A1}, \Gamma_{A2}, \Gamma_{B1}, \Gamma_{b2}$ and the equation $$\begin{pmatrix} r_1 & 1 & -\Gamma_{A1}r_1 & -\Gamma_{A1} \\ r_2 & 1 & -\Gamma_{A2}r_2 & -\Gamma_{A2} \\ K_1 & K_1r_1 & -K_2 & -K_2r_1 \\ K_3 & K_3r_2 & -K_4 & -K_4r_2 \end{pmatrix} A = C(r_1,r_2)A = 0 \quad (70)$$

wherein
$K_1 = M1_{22} + M1_{21}\Gamma_{B1}$,
$K_2 = M1_{12} + M1_{11}\Gamma_{B1}$,
$K_3 = M1_{22} + M1_{21}\Gamma_{B2}$,
$K_4 = M1_{12} + M1_{11}\Gamma_{B2}$.

Suitably, a matched termination is selected for $r_1$, i.e. $r_1 = 0$. The reflection $r_2$ should significantly differ from $r_1$, i.e. it should be as large as possible, so that for example a non-perfect short circuit is recommended. The exact value of this short circuit may then be determined by way of $$det C(r_2) = 0, \quad (71)$$

i.e. in the final analysis it may be determined from $$r_2 = \left[ \frac{(K_1K_4 - K_2K_3)(\Gamma_{A1} - \Gamma_{A2})}{(K_2 - K_1\Gamma_{A2})(K_4 - K_3\Gamma_{A1})} \right]^{\frac{1}{2}} \quad (72)$$

When the reflection $r_2$ is known, for example when it is a short circuit or open circuit of known characteristics, it need only be linked to one of the two test ports, and the evaluation of equation (72) is then omitted.

The three port circuit 2 need not satisfy any special requirements. It should only function reproducibly and should result in independent measured values in its two different states. For example, a switch would be suitable therefor. This switch need neither be well-matched nor exhibit equal mismatching in both states nor exhibit slight or symmetrical crosstalk. It should be noted, however, that small crosstalk has a beneficial influence on the error response if the test item is of extremely low transmittance.

Figure 2:
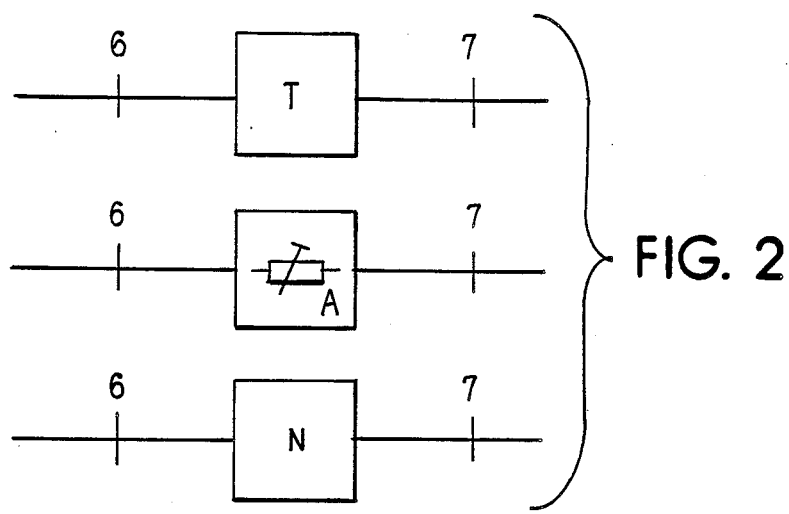
FIGS. 2-7 are schematic representations of standards for connection between the specified ports in FIG. 1 in an arbitrary sequence.
Figure 3:
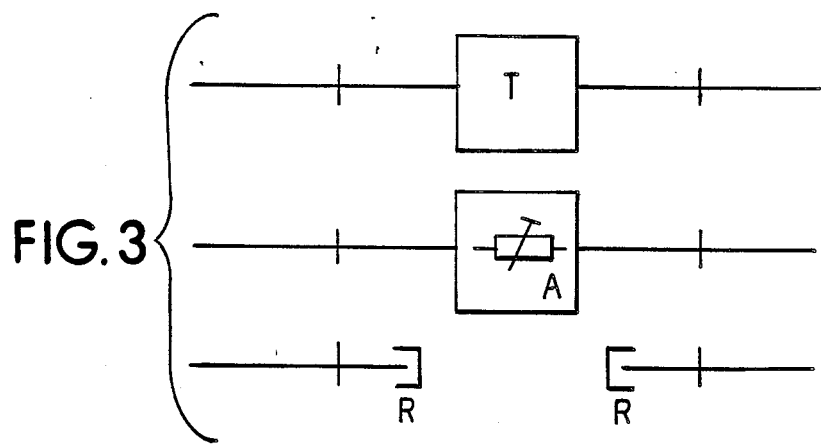
Figure 4:
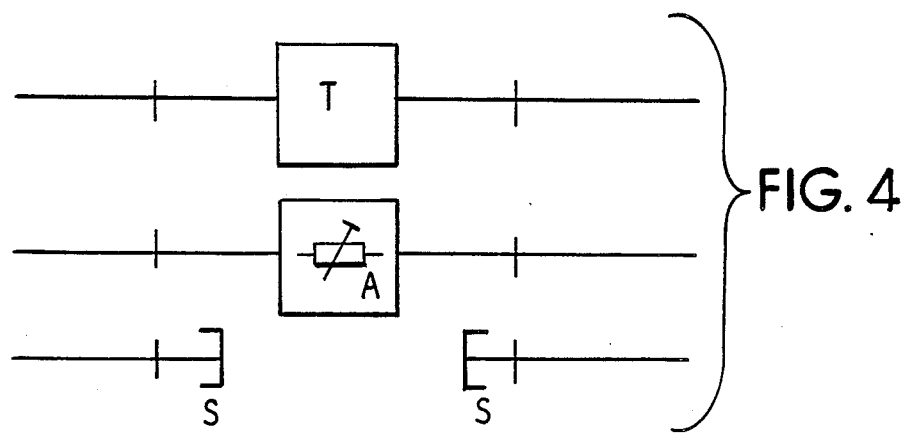
Figure 5:
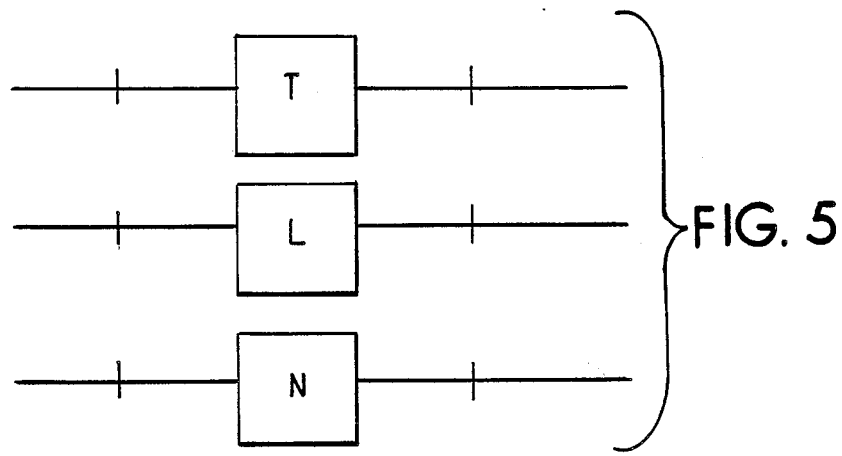
Figure 6:
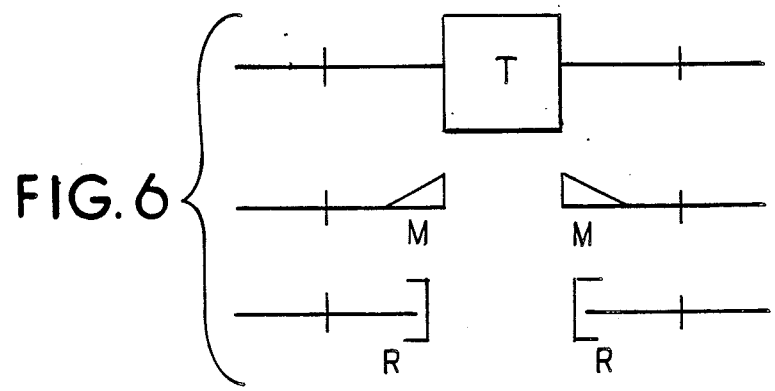
Figure 7:
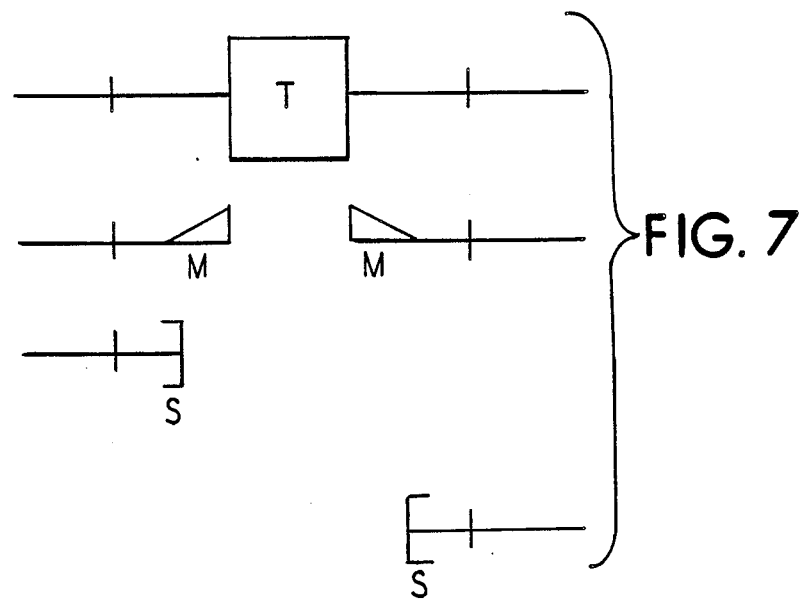

FIGS. 2-4 illustrate different standards which may be connected between the measurement ports 6 and 7 of FIG. 1 in arbitrary sequence. These standards have been provided with specific reference characters which designate the respective character thereof including T for through connection, A for attenuator, N for network, L for lying, R for reflection, S for short circuit, M for match and O for open circuit.

We claim:

1. A method of calibrating a network analyzer, in which calibration measurements are performed successively in any desired order on three different calibration standards linked between the two test ports, characterized by
    using as the first calibration standard a two-port all of whose complex scattering parameters are known,
    using as the second calibration standard an attenuator of arbitrary transmission but known reflection, and
    measuring on both test ports by means of a third calibration standard an arbitrary reflection which is, however, different from the reflection of the second calibration standard.

2. The method as claimed in claim 1, characterized by using as said third calibration standard a two-port circuit with arbitrary reflection which is, however, equal on either side and different from the reflection of the second calibration standard.

3. The method as claimed in claim 2, characterized in that the two-port circuit used as said third calibration standard is a series impedance.

4. The method as claimed in claim 2, characterized in that the two port used as said third calibration standard is a shunt impedance.

5. The method as claimed in claim 1, characterized in that the first calibration two-port circuit is implemented by a direct linking of the two test ports.

6. The method as claimed in claim 5, characterized in that the said calibration attenuator is non reflectively matched.

7. The method as claimed in claim 1, characterized in that said calibration attenuator is non-reflectively matched.

8. The method as claimed in claim 1, characterized in that said calibration attenuator exhibits equal transmission in forward and reverse directions.

9. The method as claimed in claim 1, characterized in that said calibration attenuator exhibits different transmission in forward and reverse directions (insulator).

10. The method as claimed in claim 1, characterized by using as said third calibration standard a one-port circuit of known reflection which is linked to only one of the test ports.

11. The method as claimed in claim 1, characterized by using as said third calibration standard a one-port circuit of unknown reflection which is linked to each of the two test ports in succession.

12. A method of calibrating a network analyzer, in which calibration measurements are performed successively in any desired order on three different calibration standards linked between the two test ports, characterized by
    using as the first calibration standard a two-port circuit all of whose complex scatter parameters are known,
    using as the second calibration standard a line of arbitrary length but known reflection, and
    using as the third calibration standard a two-port circuit with arbitrary reflection which is, however, equal on both sides and different from the reflection of said second calibration standard.

13. The method as claimed in claim 12, characterized in that said first calibration two-port circuit is implemented by a direct linking of the two test ports.

14. A method of calibrating a network analyzer, in which calibration measurements are performed successively in any desired order on three calibration standards linked between the two test ports, characterized by
    using as the first calibration standard a two-port circuit all of whose complex scattering parameters are known,
    using as the second calibration standard a one-port circuit of known reflection which is linked to each of the two test ports in succession, and using as the third calibration standard a one-port circuit of arbitrary reflection which, however, differs from the reflection of said second calibration standard, said oneport being linked to each of the two test ports in succession.

15. The method as claimed in claim 14, characterized in that the one-port circuit used as said second calibration standard is a non-reflective termination.

16. The method as claimed in claim 15, characterized in that said third calibration one-port circuit is formed by a short circuit.

17. The method as claimed in claim 15, characterized in that said third calibration one-port circuit is formed by an open circuit.

18. The method as claimed in claim 14, characterized in that said first calibration two-port circuit is implemented by a direct linking of the two test ports.

19. The method as claimed in claim 18, characterized in that the one-port circuit used as said second calibration standard is a non-reflective termination.

20. The method as claimed in claim 19, characterized in that said third calibration one-port circuit is formed by a short circuit which is linked to only one of the test ports.

21. The method as claimed in claim 19, characterized in that said third calibration one-port circuit is formed by an open circuit which is linked to only one of the test ports.

22. The method as claimed in claim 18, characterized in that said third calibration one-port circuit is formed by a short circuit.

23. The method as claimed in claim 18, characterized in that said third calibration one-port circuit is formed by an open circuit.

24. The method as claimed in claim 14, characterized in that said third calibration one-port circuit is formed by a short circuit which is linked to only one of the test ports.

25. The method as claimed in claim 14, characterized in that said third calibration one-port circuit is formed by an open circuit which is linked to only one of the test ports.

* * * * *